United States Patent
Randolph et al.

(10) Patent No.: US 10,023,955 B2
(45) Date of Patent: Jul. 17, 2018

(54) SEED LAYER LASER-INDUCED DEPOSITION

(75) Inventors: Steven Randolph, Portland, OR (US);
Marcus Straw, Portland, OR (US)

(73) Assignee: FEI Company, Hillsboro, OR (US)

( * ) Notice: Subject to any disclaimer, the term of this patent is extended or adjusted under 35 U.S.C. 154(b) by 1230 days.

(21) Appl. No.: 13/600,735

(22) Filed: Aug. 31, 2012

(65) Prior Publication Data
US 2014/0065319 A1    Mar. 6, 2014

(51) Int. Cl.
C23C 16/02    (2006.01)
C23C 16/04    (2006.01)
C23C 16/18    (2006.01)

(52) U.S. Cl.
CPC ........ C23C 16/0281 (2013.01); C23C 16/047 (2013.01); C23C 16/18 (2013.01)

(58) Field of Classification Search
None
See application file for complete search history.

(56) References Cited

U.S. PATENT DOCUMENTS

| | | | |
|---|---|---|---|
| 5,104,684 A * | 4/1992 | Tao | C23C 16/047 118/723 FI |
| 5,174,826 A | 12/1992 | Mannava et al. | |
| 7,504,136 B2 | 3/2009 | Boyd et al. | |
| 8,617,668 B2 | 12/2013 | Toth et al. | |
| 2005/0233079 A1* | 10/2005 | Yamasaki et al. | 427/248.1 |
| 2009/0110848 A1 | 4/2009 | Maxwell et al. | |
| 2010/0197142 A1 | 8/2010 | Randolph et al. | |
| 2010/0255213 A1* | 10/2010 | Faber | B29C 64/135 427/551 |

(Continued)

FOREIGN PATENT DOCUMENTS

| | | |
|---|---|---|
| CN | 101746709 A | 6/2010 |
| CN | 101981678 A | 2/2011 |

(Continued)

OTHER PUBLICATIONS

Haight et al. "Metal deposition with femtosecond light pulses at atmospheric pressure". Journal of Vacuum Science Technology A vol. 21 (3) (2003).*

(Continued)

*Primary Examiner* — Dah-Wei D. Yuan
*Assistant Examiner* — Jose Hernandez-Diaz
(74) *Attorney, Agent, or Firm* — Scheinberg & Associates, P.C.; Michael O. Scheinberg; John B. Kelly

(57) ABSTRACT

A method of creating a layer of a target deposit-material, in a first target pattern, on a substrate surface. The substrate surface is placed in a vacuum and exposed to a first chemical vapor, having precursor molecules for a seed deposit-material, thereby forming a first substrate surface area that has adsorbed the precursor molecules. Then, a charged particle beam is applied to the first substrate surface area in a second target pattern, largely identical to the first target pattern thereby forming a seed layer in a third target pattern. The seed layer is exposed to a second chemical vapor, having target deposit-material precursor molecules, which are adsorbed onto the seed layer. Finally, a laser beam is applied to the seed layer and neighboring area, thereby forming a target deposit-material layer over and about the seed layer, where exposed to the laser beam.

21 Claims, 3 Drawing Sheets

(56) References Cited

U.S. PATENT DOCUMENTS

| | | | |
|---|---|---|---|
| 2010/0316811 A1* | 12/2010 | Mulders | C23C 18/08 |
| | | | 427/552 |
| 2011/0115129 A1 | 5/2011 | Straw et al. | |
| 2012/0003394 A1 | 1/2012 | Mulders et al. | |
| 2012/0103945 A1 | 5/2012 | Straw et al. | |
| 2012/0196440 A1 | 8/2012 | Straw et al. | |
| 2012/0207944 A1* | 8/2012 | Finch et al. | 427/526 |
| 2012/0308740 A1 | 12/2012 | Randolph et al. | |
| 2013/0248356 A1 | 9/2013 | Rue | |

FOREIGN PATENT DOCUMENTS

| | | |
|---|---|---|
| CN | 102618844 A | 8/2012 |
| EP | 2199433 | 6/2010 |
| EP | 2283960 | 2/2011 |

OTHER PUBLICATIONS

Botman et al. Creating pure nanostructures from electron-beam-induced deposition using purification techniques: a technology perspective. Nanotechnology 20 (2009).*

Terrill et al. Laser chemical vapor deposition for microelectronics production. IEEE 1998 and Haight et al. "Metal deposition with femtosecond light pulses at atmospheric pressure". Journal of Vacuum Science Technology A vol. 21 (3) (2003).*

Adedeji, A.V., et al., 'Preparation and characterization of pyrolytically deposited (Co—V—O and Cr—V—O) thin films,' Thin Solid Films, 2002, pp. 49-54, vol. 402.

Au, Richard H.W., et al., 'Highly Ordered Macroporous Gold Film Formed by CVD Using Monodisperse Polystyrene Spheres as Templates,' Chemical Vapor Deposition, 2007, pp. 20-22, vol. 13.

Haight, R., et al., 'Metal deposition with femtosecond light pulses at atmospheric pressure,' J. Vac. Sci. Technol. A, Apr. 4, 2003, pp. 649-652, vol. 21, No. 3.

Herman, Irving, P, 'Laser-Assisted Deposition of Thin Firms from Gas-Phase and Surface-Adsorbed Molecules,' Chem. Rev., 1989, pp. 1323-1357, vol. 89.

Osono, Tetsuo, et al., 'High-rate deposition if SiNx films over 100nm/min by Cat-CVD method at low temperatures below 80° C.,' Thin Solid Films, Jan. 18, 2006, pp. 55-57, vol. 501.

Woods, Jaime B., et al., 'CVD of Titanium Oxide Thin Films from the Reaction of Tetrakis(dimethylamido)titanium with Oxygen,' Chem. Vap. Deposition, 2005, pp. 289-291, vol. 11.

Zhang, Haitao, et al., 'Deposition of tungsten nanogratings induced by a single femtosecond laser beam,' Optics Express, Apr. 30, 2007, pp. 5937-5947, vol. 15, No. 10.

Mackus, A. J. M., et al., "Nanopatterning by direct-write atomic layer deposition," Nanoscale, 2012, pp. 4477-4480, vol. 4.

* cited by examiner

SEED LAYER LASER-INDUCED DEPOSITION

TECHNICAL FIELD OF THE INVENTION

The present invention relates to a method of depositing material onto a substrate.

BACKGROUND OF THE INVENTION

Charged particle beam induced deposition processes such as electron beam induced deposition (EBID) or ion beam induced deposition (IBID) involve the dissociation of surface-adsorbed precursor molecules via electron or ion bombardment. As typically implemented, a gas-phase precursor is delivered through a hollow needle positioned just millimeters from the surface of a substrate located in a high vacuum system. Having formed an adsorbed layer on the substrate surface, the adsorbate-covered surface irradiated by a charged particle beam. As the charged particles cross the substrate-vacuum interface, they transfer some of their energy through inelastic scattering to the precursor molecules adhered to the substrate surface. If the energy transferred is sufficient, molecular bonds are broken and the precursor "dissociates" into stable, solid phase components and volatile by-products. The solid components attach to the surface forming a deposit, thus enabling the direct writing of nanometer to micrometer sized features. This process is typically referred to as deposition. The volatile by-products produced by the dissociation process, subsequently desorb from the substrate and are removed by a pumping system.

It is well known that electron and ion beams can be focused to spot sizes smaller than those achievable with traditional light optics. As a result, the features produced by charged particle beam induced deposition processes can be made smaller than those produced by laser induced processes such as pulsed laser deposition (PLD) and direct-write laser-assisted deposition. However, because E/IBID are relatively slow processes, thick deposits or deposits made over large areas using these techniques can result in long processing times. In addition, the purity of the deposits made with charged particle beam techniques is often low. For deposits that are ideally conductive (e.g. platinum), low purity (e.g. carbon contamination) results in lower than ideal conductivity. In general, contaminant incorporation deteriorates the desired properties of the targeted material for deposition.

There are beam chemistry related references directed toward improvement of purity and/or material properties either through novel processing, post-processing, or novel precursor selection. One such reference describes a novel precursor—hexamethylditin—which can be used to deposit a high purity, low resistivity tin material with IBID. Another is a beam-seeded atomic layer deposition (ALD) technique work where an EBID seed is used to direct the growth via atomic layer depositions via cyclical spontaneous reactions. The result is a pure deposit localized at the catalyst. Both techniques may have drawbacks, however. The tin deposition tends to work only in vias and subsurface features where there is a high degree of gas confinement. The ALD process can be somewhat slow and irreproducible and is subject to problems with vacuum contamination. There are many references for continuous wave and nanosecond pulsed laser induced deposition with both photolytic and pyrolytic mechanisms. But these mechanisms tend to heat the substrate, which can be undesirable.

Accordingly, there is an unmet need for novel high purity deposition processes; in particular there is a need for processes that enable both large and small area deposition of pure metals, dielectrics, and semiconductors.

SUMMARY OF THE INVENTION

An object of the invention is to deposit a material in an arbitrary pattern onto a substrate.

In a first separate aspect, the present invention is a method of creating a layer of a target deposit-material on a substrate surface. The method begins with the placement of a substrate surface in a vacuum and the act of exposing the substrate surface to a first chemical vapor, comprised of precursor molecules which, when irradiated with a charged particle beam, form a deposited seed layer only in the region of charged particle irradiation. The purpose of the initial charged-particle-induced localized deposition is that the deposited material encourages subsequent deposition of the target deposit-material by changing the optical absorption characteristics, changing the sticking coefficient/residence time of the target deposit-material precursor gas, and/or lowering the activation barrier for dissociation. The result of the deposition of the seed layer is the formation of a new solid surface that can subsequently be covered with a layer of precursor molecules. The seed layer is then exposed to a second chemical vapor (being the same or different from the original precursor) comprised of target deposit-material precursor molecules. The target deposit-material precursor molecules adsorb onto the seed layer. Finally, a laser beam is applied to the substrate. A target deposit-material layer is formed over and about the intersection of the seed layer and the area to which the laser beam is applied, which may be due to the aforementioned changes in activation barrier, optical absorption properties and/or vapor adsorption properties. In one preferred embodiment the charged particle beam is scanned over the substrate to form a patterned seed layer, but in another preferred embodiment it is held stationary.

In a second separate aspect, the present invention may take the form of a method of depositing a layer of a target deposit-material onto a substrate surface—having a seed layer that facilitates laser induced deposition of the target deposit-material. The method begins with the placement of the substrate surface area into a vacuum and the act of exposing the substrate surface area to a chemical vapor comprised of precursor molecules for the target deposit-material. Then, a laser beam is applied to the area and a target deposit-material layer forms where the laser beam is applied to the seed layer.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the present invention are directed to method of depositing material on a substrate surface.

Definition: An ultrashort pulsed laser is a laser that emits pulses of light with durations less than 10 picoseconds. Functionally, the ultrashort regime is entered when the intensity dependence of the material response is dominated by the square (or higher order) of the electric field. An ultrashort pulsed laser beam is a beam emitted by an ultrashort pulsed laser.

Figure 1:
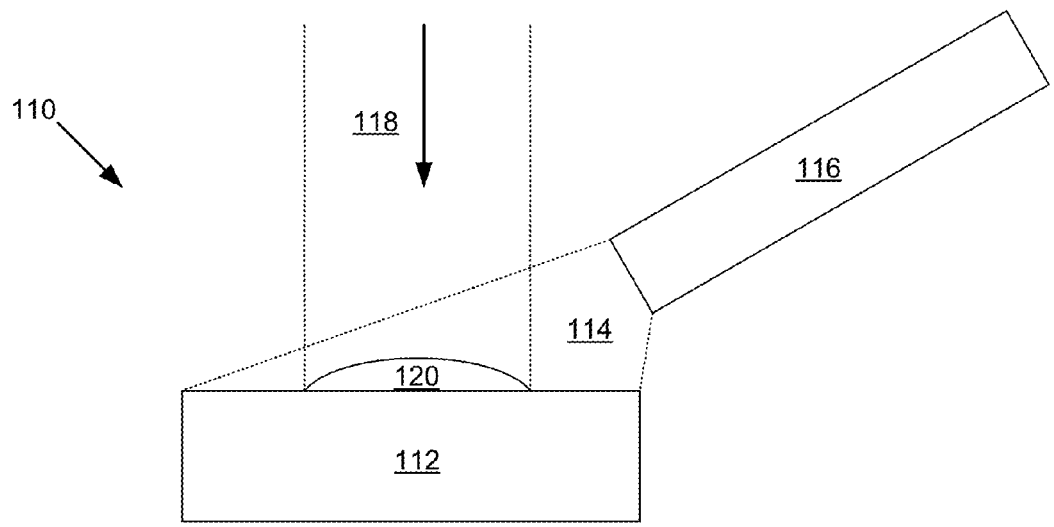
FIG. 1 shows a schematic illustration of a first stage in the process of the present invention.
Figure 2:
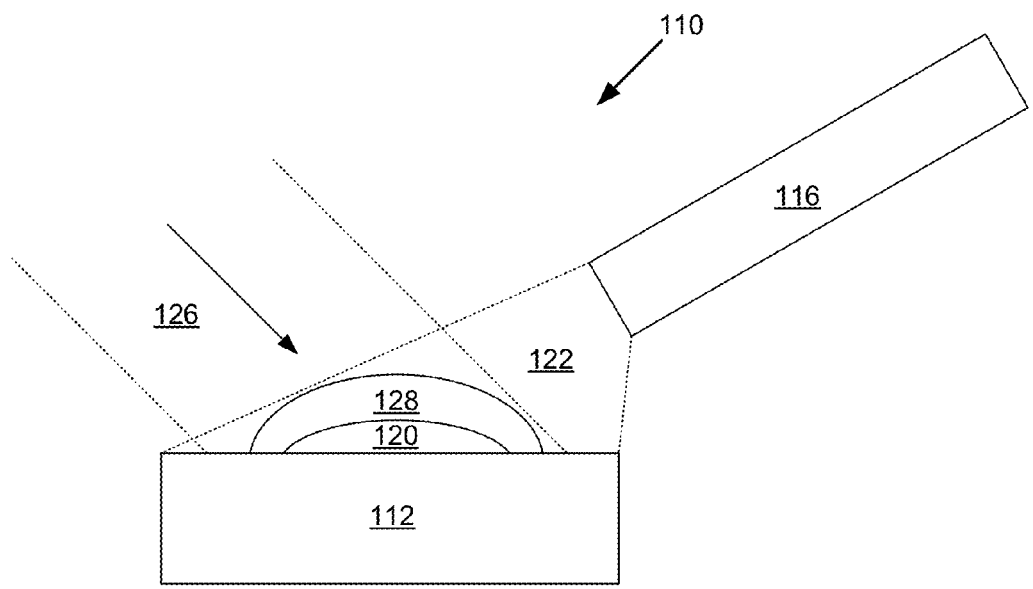
FIG. 2 shows a schematic illustration of a final stage of the process of the present invention.
Figure 3:
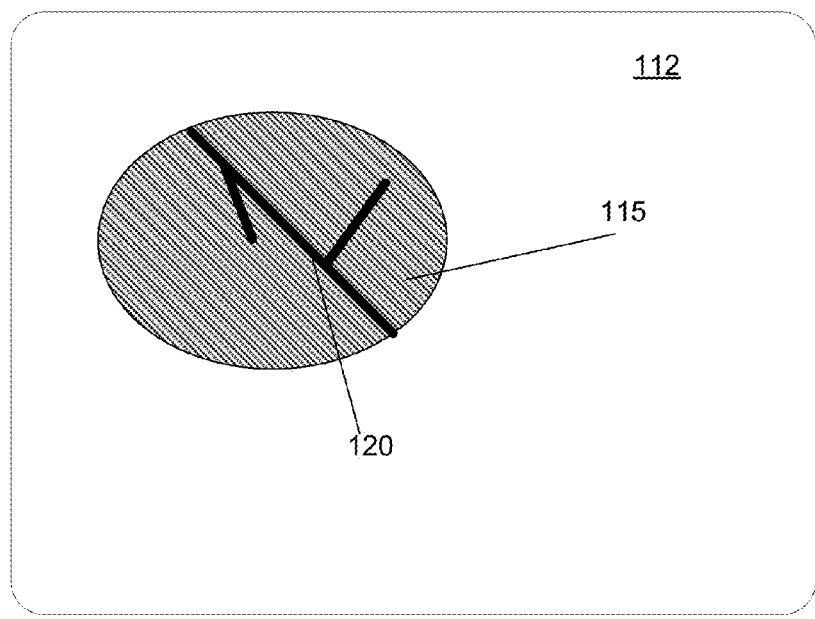
FIG. 3 shows a plan view of a substrate region after performance of the process stage illustrated in FIG. 1.
Figure 5:
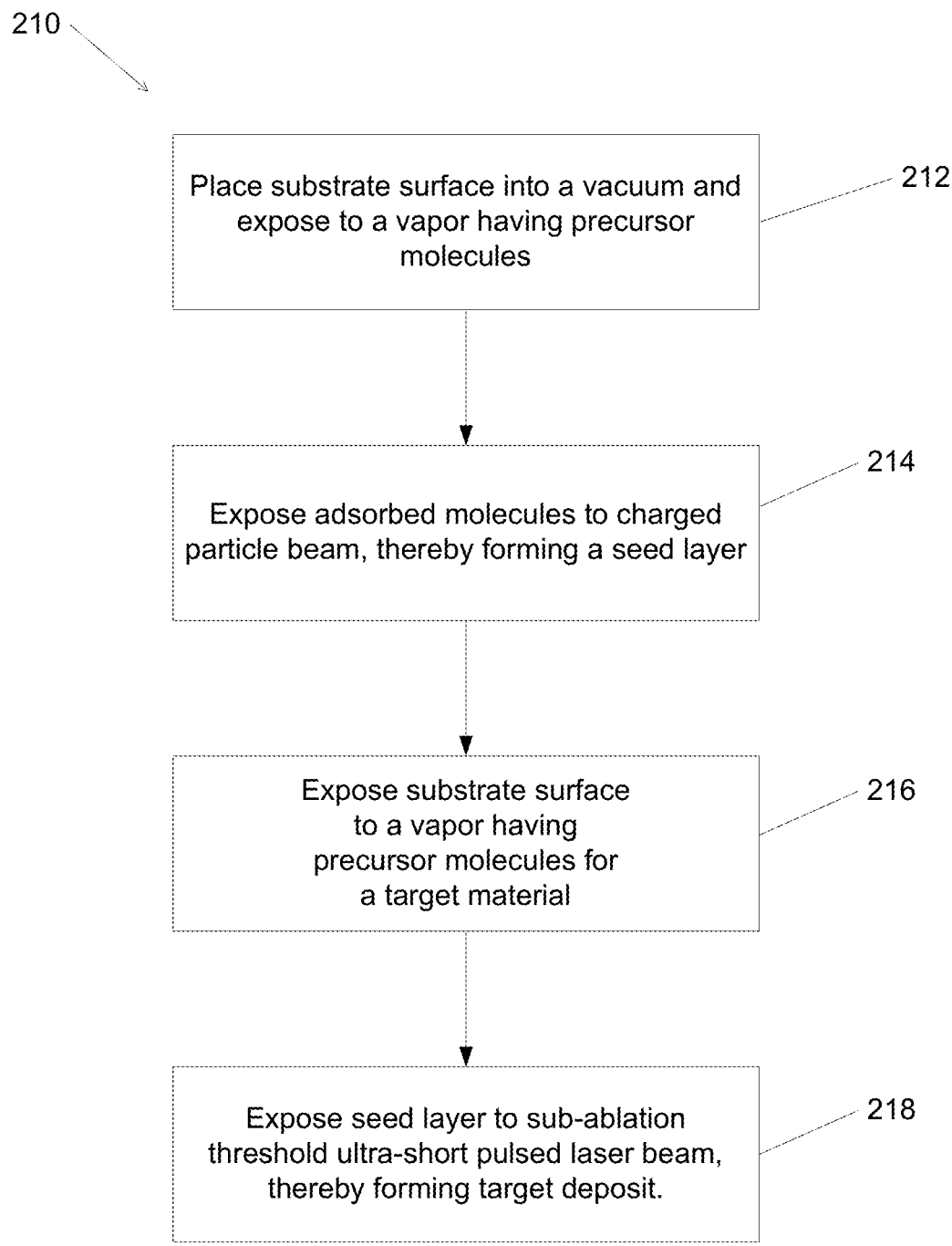
FIG. 5 is a flow chart of the process of the present invention.

Referring to FIGS. 1 and 5, a configuration 110, for implementing a preferred method 210 (FIG. 5) of practicing the present process invention, includes, in a vacuum, a substrate 112 that is exposed to a vapor 114 by a gas injection source 116 (step 212). Typically (but not necessarily), source 116 is a needle positioned less than 1 mm over the surface of substrate 112. Vapor 114 includes precursor molecules for a seed deposit-material, which become adsorbed onto the surface of substrate 112, forming a layer of adsorbed molecules 115 (FIG. 3).

Irradiation of adsorbed precursor molecules 115 with a charged particle beam 118 (step 214) results in the dissociation of the precursor molecules 115, and a deposit of a seed layer 120, of seed deposit-material. In one preferred embodiment seed layer 120 is a catalytic metal, such as platinum. In this instance, the platinum layer 120 is impure, apparently because the power density of a charged particle beam is insufficient to effect the complete dissociation of the precursor molecules so carbon and/or other atoms are deposited along with the platinum. A catalytic metal seed layer encourages deposition of target deposit-material by lowering the activation barrier for dissociation of the target deposit-material precursor molecules. In another preferred embodiment, the seed deposit-material changes the sticking coefficient/residence time of the target-deposit material or changes the optical absorption characteristics of the substrate.

Figure 4:
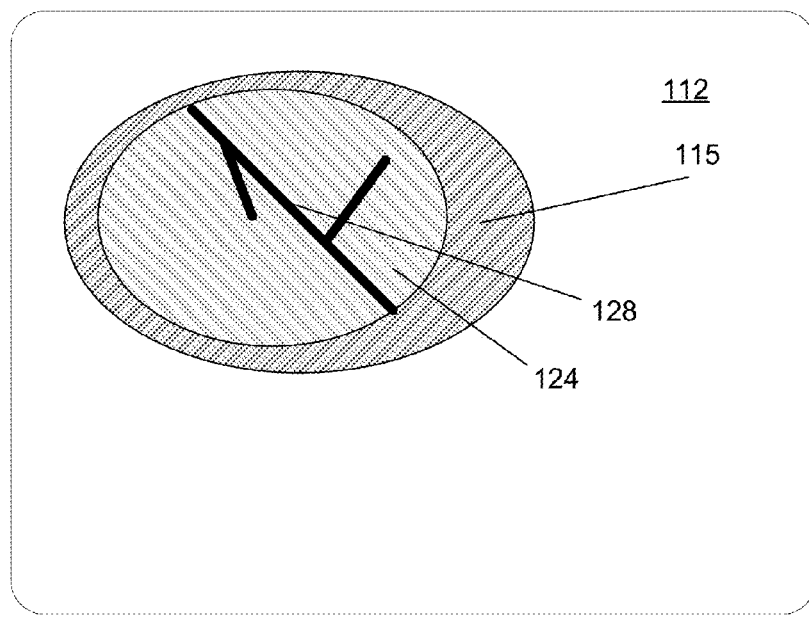
FIG. 4 shows a plan view of the substrate region of FIG. 3 after performance of the process stage illustrated in FIG. 2.

Following the creation of seed layer 120, the charged particle beam 118 is discontinued and the seed layer 120 is exposed to a second vapor 122 (step 216), which has precursor molecules of a target material, which are also absorbed onto the substrate surface, to form an adsorbed second precursor molecule area 124 (FIG. 4). The area 124 is contemporaneously treated with an ultrashort pulsed laser 126 (step 218). The result is a highly pure deposit 128 of target deposit-material, closely matching, but slightly expanded from, the catalytic seed layer 120. In the case where deposit 128 is of platinum, it is of a much higher purity than the catalytic seed layer 120.

Although in one preferred embodiment the target material is platinum, there are many other preferred embodiments, each depositing a different material on and about the seed layer. In an alternative preferred embodiment the target deposit-material is carbon, and carbon precursor molecules are used to provide a carbon deposit 128, on seed layer 120.

In one preferred embodiment, the charged particle beam spot size on the target is on less than 10 nm. The catalytic see layer 120 is typically wider than the spot size due to the spread of secondary and primary charged particles. The line width of the catalytic seed layer 120 is preferably between 100 and 150 nm, more preferably between 50 and 100 nm, and most preferably between 10 and 50 nm. The line width of the laser-induced deposit is preferably between 110 and 160 nm more preferably between 60 and 110 nm, and most preferably between 15 and 60 nm. The line width which compares favorably to the resultant widths from currently available techniques, and may be advantageously used in the creation of micro-circuitry.

In another preferred method, a wider catalytic seed layer is created, which may have a closed geometric shape, such as a rectangle, either through the use of a wider charged particle beam 118, or through scanning an area with the beam 118. Although other techniques are known for creating a pure layer of material, when there is no restriction as to width, the advantage of the present method is that a layer 120 of pure target material can be created without subjecting the substrate, or the layer 120 as it is being formed, to potentially destructive heat. The techniques described above may be performed at a wide range of temperature, including about 20° C. (approximately room temperature).

As noted, in a preferred embodiment laser beam 124 is an ultrashort pulsed laser beam. This beam has the advantage of having a fluence that is low enough so that no appreciable ablation or heating of the substrate occurs. In some situations, however, heating the substrate is permissible. Accordingly, in alternative preferred embodiments, another type of laser is used, including picosecond, nanosecond, or continuous wave lasers.

In one preferred embodiment, vapor 114 includes molecules of trimethyl(methylcyclopentadienyl) platinum, a platinum precursor. In another preferred embodiment, vapor 114 includes molecules of dicobalt octacarbonyl, a cobalt precursor. A skilled person can readily determine other suitable precursor gases for the catalytic layer and for the desired metal layer. Suitable precursors gases for the catalyst layer 120 and the target material deposit layer 128 have the following properties: a high vapor pressure, deposit material-to-ligand bond energy low enough to be disassociated by the charged particle beams but not so low as to spontaneously disassociate, a high sticking coefficient and a long residence time. In one preferred embodiment substrate 112 is a semiconductor substrate, such as a silicon substrate, in another preferred embodiment the substrate is an oxide, such as $SiO_2$. In general, a wide range of substrates may be used.

Deposition rates for the seed layer depend on the beam current, but a typical deposition rate is 0.4 $um^3$/min. Laser-induced deposition of the target material (which may be pure metal) typically occurs at a rate of between 0.8 and 1.2 $um^3$/min, and more preferably between 1.0 and 1.5 $um^3$/min. The purity of the laser-induced deposition is typically greater than 40%, more preferably greater than 60%, and most preferably greater than 80%.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

In an additional preferred embodiment, the initial seed layer is deposited and the laser induced deposition process is performed as described above. After this, however, an additional seed layer is deposited, followed again by the laser deposition of a further target-deposit material. This two-layer deposition process is performed iteratively until a desired thickness is reached. This process can be used to cyclically create a layered deposit that adheres more closely to a desired shape and interior structure than would otherwise be possible. In one preferred embodiment, the precursor molecules for the further target deposit-material layers are varied from one deposition cycle to the next, to create an interleaved stack of materials. In this embodiment, the precursor molecules for the charged particle beam-deposited seed layers may also be varied, to optimize for multiple target deposit-material layers. As an example, several differing precursors could be used to create a stack of light emitting materials and metals in-situ to allow for fabrication of a light emitting diode, a diode laser, a quantum well structure, or other light emitting device.

The following table lists precursor molecules that may be used in the processes described above. This is not a comprehensive list, and is provided by way of example.

TABLE

| LIST OF PRECURSOR MOLECULES | |
|---|---|
| $Al(CH_3)_3$ | Trimethyl aluminum |
| $AlCl_3$ | Aluminum trichloride |
| $AgBF_4$ | Silver tetrafluoroborate |
| $AuCl_3$ | Gold trichloride |
| $AuCl(PF)_3$ | Gold chloride trifluorophosphine |
| $Au(CH_3)_2$ (acac) | Dimethyl gold acac |
| $Au(CH_3)_2$ (hfac) | Dimethyl gold hfac |
| $Au(CH_3)_2$(tfac) | Dimethyl gold tfac |
| $(C_4H_9)_4Au_2F_2$ | Tetrakis isobutyl diaurum difluoride |
| $(C_4H_9)_2AuF_2Pd(C_6H_{11})$ | Bis isobutyl aurum (III) cyclohexyl palladium (II) difluoride |
| $Co_2(CO)_8$ | Dicobalt octacarbonyl |
| $Co_4(CO)_{12}$ | Tetracobalt dodecacarbonyl |
| $Co(CO)_3NO$ | Cobalt tricarbonyl nitrosyl |
| $Cr(C_6H_6)_2$ | Diarene chromium |
| $Cr(CO)_6$ | Chromium hexacarbonyl |
| Cu-DMB-hfac | Copper DMB hfac |
| $Cu(hfac)_2$ | Copper di-(hfac) |
| Cu-MHY-hfac | Copper MHY hfac |

Abbreviations:
acetylacetonate (acac),
hexafluoroacetylacetonate (hfac),
trifluoroacetylacetonate (tfac),
dimethyl bipyridene (DMB),
2-methyl-1-hexene-3-yne (MHY),
vinyltrimethylsilane (VTMS),
Cp (cyclopentadienyl

We claim as follows:

1. A method of creating a layer of a target deposit material, comprising:

(a) placing a substrate surface in a vacuum and exposing said substrate surface to a first chemical vapor, comprised of precursor molecules for a seed deposit material, thereby forming a first substrate surface area having adsorbed said precursor molecules for said seed deposit material;

(b) applying a charged particle beam to said first substrate surface area, thereby forming a catalytic seed layer, at and about the intersection of said charged particle beam and said first substrate surface;

(c) exposing said catalytic seed layer to a second chemical vapor, having target deposit material precursor molecules, thereby causing target deposit material precursor molecules to become adsorbed onto and about said catalytic seed layer;

(d) applying a laser beam to said seed layer, the laser causing the adsorbed target deposit material precursor molecules to dissociate thereby forming a target deposit material layer by means of laser-induced deposition over and about said catalytic seed layer, where said laser beam has been applied;

in which the target deposit material layer has greater purity than the catalytic seed layer; and in which the substrate surface, the catalytic seed layer, and the target deposit material layer are not heated throughout the execution of the method.

2. The method of claim 1, wherein said seed deposit material is a catalytic metal.

3. The method of claim 2, wherein said catalytic metal is platinum and said precursor molecules are trimethyl (methylcyclopentadienyl) platinum.

4. The method of claim 1, wherein said target deposit material is the same as said seed deposit material.

5. The method of claim 1, wherein said first and second chemical vapors are the same.

6. The method of claim 1, wherein said laser beam is an ultrashort pulsed laser beam.

7. The method of claim 1, wherein said target deposit material layer forms a pattern having pattern features and includes at least one pattern feature having a width of less than 100 nm.

8. The method of claim 7, wherein said pattern is a filled closed geometrical shape.

9. The method of claim 1, further comprising:

(a) exposing said substrate surface to a second seed layer chemical vapor, comprised of precursor molecules for a second seed deposit material, thereby forming a second substrate surface area having adsorbed said precursor molecules for said second seed deposit material;

(b) applying a charged particle beam to said second substrate surface area, thereby forming a second catalytic seed layer, at and about the intersection of said charged particle beam and said second substrate surface;

(c) exposing said second catalytic seed layer to a second target deposit material chemical vapor, having second target deposit material precursor molecules, thereby causing target deposit material precursor molecules to become adsorbed onto and about said second catalytic seed layer;

(d) applying a laser beam to said second seed layer, the laser causing the adsorbed target deposit material precursor molecules to dissociate thereby forming a second target deposit material layer by means of laser-induced deposition over and about said second catalytic seed layer, where said laser beam has been applied;

in which the second target deposit material layer has greater purity than the second catalytic seed layer; and in which the second catalytic seed layer and second the target deposit material layer are not heated throughout the execution of the method.

10. The method of claim 9, wherein steps (a)-(d) are performed iteratively using different second chemical vapors in different iterations, until a layered deposit is formed having predetermined characteristics.

11. The method of claim 1 in which an atomic layer deposition (ALD) process is not used to form the catalytic seed layer.

12. The method of claim 1 in which applying a charged particle beam to said first substrate surface area, thereby forming a catalytic seed layer, comprises depositing an impure layer, and in which depositing an impure layer comprises depositing a metal layer incorporating carbon.

13. The method of claim 1 in which applying a charged particle beam to said first substrate surface area, thereby forming a catalytic seed layer comprises applying a charged particle beam having a power density that is insufficient to effect the complete dissociation of the precursor molecules.

14. The method of claim 1 in which applying a charged particle beam to said first substrate surface area, thereby forming a catalytic seed layer comprises applying a seed layer that is thicker than a monolayer.

15. The method of claim 1 in which the substrate surface, the catalytic seed layer, and the target deposit material layer are maintained substantially at room temperature throughout the execution of the method.

16. The method of claim 1 in which the purity of the target deposit material layer is greater than 40%.

17. A method of depositing a material onto a substrate, comprising:

providing a precursor at the substrate surface;

directing a charged particle beam toward the substrate surface to decompose the precursor to produce a patterned seed layer by charged particle beam-induced deposition;

providing a second precursor at the substrate surface;

depositing a second layer onto the seed layer using laser beam-induced decomposition of the precursor, the laser causing selective deposition onto the seed layer;

in which the target deposit material layer has greater purity than the patterned seed layer; and in which the substrate surface, the patterned seed layer, and the second layer are not heated throughout the execution of the method.

18. The method of claim 17 in which the laser is an ultrashort pulsed laser.

19. The method of claim 17 in which the first precursor and the second precursor comprise the same gas.

20. The method of claim 17 in which the substrate surface, the catalytic seed layer, and the target deposit material layer are maintained substantially at room temperature throughout the execution of the method.

21. The method of claim 17 in which the purity of the target deposit material layer is greater than 40%.

* * * * *